United States Patent
Nagata

(10) Patent No.: US 8,273,507 B2
(45) Date of Patent: Sep. 25, 2012

(54) PELLICLE FOR LITHOGRAPHY AND A METHOD FOR MAKING THE SAME

(75) Inventor: Yoshihiko Nagata, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 144 days.

(21) Appl. No.: 12/926,481

(22) Filed: Nov. 22, 2010

(65) Prior Publication Data

US 2011/0132258 A1    Jun. 9, 2011

(30) Foreign Application Priority Data

Dec. 7, 2009  (JP) ................................ 2009-277340

(51) Int. Cl.
*G03F 1/64* (2012.01)
*G03F 1/62* (2012.01)
*A47G 1/12* (2006.01)

(52) U.S. Cl. ............................................. 430/5; 428/14
(58) Field of Classification Search ......... 430/5; 428/14
See application file for complete search history.

(56) References Cited

U.S. PATENT DOCUMENTS 8,026,023 B2 *   9/2011   Hamada ........................... 430/4

* cited by examiner

*Primary Examiner* — Stephen Rosasco
(74) *Attorney, Agent, or Firm* — Manabu Kanesaka

(57) ABSTRACT

There is provided a pellicle in which the frame is chamfered along all of its horizontal edges (as viewed when the pellicle frame is laid flat), and in particular those edges of the frame where the membrane-bonding frame face meets the external side walls of the frame are chamfered to the extent of C:0.01 mm-C:0.12 mm; in relation to this chamfer, a method is also provided wherein, after attaching a preformed pellicle membrane to the membrane-bonding frame face, the excessive part of the preformed membrane which extends beyond outer edges of the frame face is cut off in a manner wherein a blade of a knife is caused to scour the chamfer over the membrane in a manner such that the knife blade is kept in such an angle that the blade gets in a face-to-face contact with the chamfer face or that the blade touches only that edge of the frame where the chamfer face meets the first frame face while the knife blade is moved along the chamfered edge of the frame.

5 Claims, 3 Drawing Sheets

PELLICLE FOR LITHOGRAPHY AND A METHOD FOR MAKING THE SAME

RELATED APPLICATIONS

The present application claims priority from Japanese Application No. 2009-277340, filed Dec. 7, 2009, the disclosure of which is hereby incorporated by reference herein in its entirety.

The present application claims priority from Japanese Application No. 2009-277340 filed on Dec. 7, 2009, the disclosure of which is hereby incorporated by reference herein in its entirety.

FIELD OF THE INVENTION

This invention concerns a pellicle for lithography used as a dust-fender for masks employed in lithographic printing to manufacture semiconductor devices such as LSI and super-LSI, and liquid crystal display board.

TECHNICAL BACKGROUND OF THE INVENTION

In manufacturing semiconductor devices such as LSI and super-LSI or in manufacturing a liquid crystal display board or the like, a pattern is made by irradiating light to a semiconductor wafer or an exposure original plate (a mask for lithography) for liquid crystal, but if a dust adheres to the exposure original plate, the dust absorbs light or refracts it, causing deformation of a transferred pattern, roughened edges or black stains on a base, and leads to a problem of damaged dimensions, poor quality, deformed appearance and the like.

Thus, these works are usually performed in a clean room, but, even in a clean room, it is still difficult to keep the exposure original plate clean all the time. Therefore, a pellicle, through which the light for exposure passes well, is attached to a surface of the exposure original plate as a dust-fender.

Under such circumstances, foreign substances do not directly adhere to the surface of the exposure original plate, but only onto the pellicle membrane, which is sufficiently removed from the surface of the exposure original plate, and thus by setting a photo focus on a lithography pattern on the exposure original plate, the foreign to substances on the pellicle membrane fail to transfer their shadows on the exposure original plate and thus no longer become a problem to the image transfer performance.

In general, a pellicle is built up of a pellicle frame, which is an endless frame bar usually made of a black almite-anodized aluminum alloy such as JIS A7075, A6061 and A5052, or a stainless steel or polyethylene, and a transparent pellicle membrane usually made of cellulose nitrate, cellulose acetate or a fluorine-containing polymer; this membrane is attached to one of the two frame faces (hereinafter referred to as "upper frame face") after laying a solvent capable of dissolving the pellicle membrane on the upper frame face and drying the solvent by air flow (ref. Publication-in-patent 1), or after laying an adhesive such as acrylic resin, epoxy resin and fluorine-containing resin (ref. Publications-in-patent 2 and 3); furthermore, on the other one of the two frame faces (hereinafter referred to as "lower frame face") is laid a mask-bonding adhesive layer made of a polybutene resin, a polyvinyl acetate resin, an acrylic resin, a silicone resin or the like for attaching the pellicle frame to the exposure original plate, such as a reticle or a mask, and over this mask-bonding adhesive layer is laid a releasable liner for protecting the mask-bonding adhesive layer. FIGS. 1 and 2 show a construction of a general type pellicle.

LIST OF PRIOR ART PUBLICATIONS

Publications-in-Patent

[Publication-in-patent 1] Japanese Laid-open Patent Application S58-219023
[Publication-in-patent 2] U.S. Pat. No. 4,861,402
[Publication-in-patent 3] Japanese Pre-Patent Publication for Public Review S63-27707

A pellicle is set in a manner such that the pellicle frame entirely surrounds the pattern region formed in the surface of the mask substrate. As the pellicle is installed for the purpose of preventing the dust from adhering to the mask substrate, the pattern region is thereby isolated from the external atmosphere so that the dust outside the pellicle cannot reach the pattern region.

In recent years, pellicles are used not only as the dust-fending cover in the semiconductor lithography for LSI and ULSI but also as the dust-fending cover for photo masks used in lithography conducted to make a TFT circuit and a color filter in the manufacturing process for a liquid crystal display board, for which higher definition is being required.

Compared to the size of a conventional pellicle for semiconductor lithography, which is at most about 150 mm in lengths of the frame sides, the pellicles used in the lithography for liquid crystal display board measure, even in smaller cases, no less than 330 mm×450 mm or so in side lengths, and in larger cases, about 850 mm×1200 mm or so.

Next, the pellicle manufacture process will be briefly explained: first the pellicle frame is washed and cleaned; the mask-bonding adhesive layer is laid on the lower frame face and cured thereon; next, a membrane-bonding adhesive is laid on the upper frame face, to which a preformed pellicle membrane of a size greater than the pellicle frame is attached by means of the membrane-bonding adhesive; then an excessive part of the preformed pellicle membrane which extends beyond the outer edges of the upper frame face is cut along those outer edges and removed; and finally, a releasable liner is pasted over the mask-bonding adhesive layer to complete the pellicle.

In the case of the pellicles used in the semiconductor lithography, the sizes of the frame sides are no more than 150 mm, so that in general the excessive portion of the preformed pellicle membrane has been cut off by directly applying a knife carried by a robot or a solvent.

PROBLEMS THE INVENTION SEEKS TO SOLVE

However, in the case of large-sized pellicles, the solvent does not easily cut through the membrane owing to the greater thickness of the membrane, and the cost of the robot increases since it has to have an extremely greater size; therefore, it has been the general practice to cut off the excessive part of the preformed membrane by a knife handled in a human hand.

However, this manual cutting has its problems in that the cutting does not proceed as smoothly as the robotic cutting, with a result that it becomes necessary to remove the cut burrs after the cutting, which lowers the product quality and increases the manufacturing time, and in that the dust occurs during the manual labor to contaminate the product.

SUMMARY OF THE INVENTION

It is, therefore, an object of the invention, in view of the above circumstances, to provide a pellicle which has no cut burrs to the pellicle membrane and to propose a method for manufacturing such a pellicle.

MEANS TO SOLVE THE PROBLEMS

In order to attain the object of the invention, the present inventor repeated studies and as a result found that it is possible to cut off the excessive part of the preformed membrane effectively if the outer edges of the upper frame face, to which the membrane-bonding adhesive is applied, is made to have a chamfer of a particular range of dimension, namely 0.01-0.12 mm in the lengths of the legs of the right isosceles triangle which is the cross section of the right-triangular prism removed from the edges where the upper frame face joins the outer side faces (walls) of the pellicle frame by chamfering, and thereby completed the invention.

Therefore, a pellicle for lithography according to the present invention is a large-sized pellicle for lithography, of which at least one of the four frame bars has a length not smaller than 300 mm, manufactured by pasting the tensed pellicle membrane on the upper frame face of the pellicle frame by means of the membrane-boning adhesive and by providing the mask-bonding adhesive layer on the lower frame face, wherein the characteristic features include that a chamfer is made along each of its edges where the upper and lower frame faces respectively join with the inner side faces (walls) and the outer side faces (walls) of the pellicle frame, and that in particular the edges where the upper frame face and the outer side faces of the pellicle frame join with each other are chamfered in a manner such that the lengths of the legs of the right isosceles triangle which is the cross section of the right-triangular prism removed from these edges by chamfering, are in a range of 0.01 millimeter to 0.12 millimeter. (This manner of chamfering is herein referred to such as "C:0.01 mm-C:0.12 mm" and similarly in other chamfer sizes.)

It is preferable that the pellicle frame is made of an aluminum alloy of which the surface is almite-anodized.

Also, a method for manufacturing the pellicle for lithography according to the present invention comprises use of a pellicle frame of which the edges where the upper and lower frame faces respectively join with the inner side faces and the outer side faces of the pellicle frame are chamfered, and in particular the edges where the upper frame face joins with the outer side faces of the pellicle frame have a chamfer of C:0.01 mm-C:0.12 mm, wherein, after attaching a preformed pellicle membrane to the upper frame face, the excessive part of the preformed membrane which extends beyond outer edges of the upper frame face is cut off in a manner wherein a blade of a knife is caused to scour a chamfer over the membrane in a manner such that the knife blade is kept in parallel with the chamfer face to effect a face-to-face contact between the knife blade and the chamfer face while the knife blade is moved along the chamfered edge of the frame.

Still another method for manufacturing the pellicle for lithography according to the present invention comprises use of a pellicle frame of which the edges where the upper and lower frame faces respectively join with the inner side faces and the outer side faces of the pellicle frame are chamfered, and in particular the edges where the upper frame face joins with the outer side faces of the pellicle frame have a chamfer of C:0.01 mm-C:0.12 mm, wherein, after attaching a preformed pellicle membrane to the upper frame face, the excessive part of the preformed membrane which extends beyond outer edges of the upper frame face is cut off in a manner wherein a blade of a knife is caused to scour a chamfer over the membrane in a manner such that the knife blade is kept in an angle such that the blade touches only that edge of the frame where the chamfer face meets the upper frame face while the knife blade is moved along the chamfered edge of the frame.

Furthermore, a still more improved method for manufacturing the pellicle for lithography according to the present invention is featured in that, while it uses a pellicle frame of which the edge's where the upper and lower frame faces respectively join with the inner side faces and the outer side faces of the pellicle frame are chamfered, and in particular the edges where the upper frame face joins with the outer side faces of the pellicle frame have a chamfer of C:0.01 mm-C:0.12 mm, after the removal of the excessive part of the preformed membrane in any one of characteristic manners described above, the cut-end faces of the membrane are applied with solvent capable of dissolving the pellicle membrane to thereby smoothen the cut-end faces by means of a resin wiper wetted with the solvent.

EMBODIMENTS TO PRACTICE THE INVENTION

The present invention concerns a pellicle for lithography and a method for manufacturing the same. The present invention shall be expounded in further detail with reference to the drawings. The pellicle of the present invention is to b used for semiconductor lithography, etc. and especially appropriate for TFT circuit formation exposure process for manufacturing large-sized liquid crystal display and for color filter formation exposure process.

Figure 1:
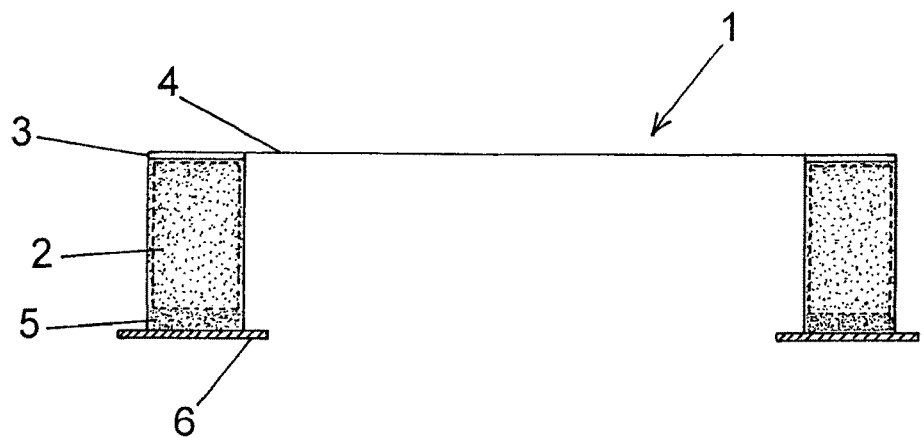
FIG. 1 is a cross-sectional view illustrating a pellicle of the present invention.
Figure 2:
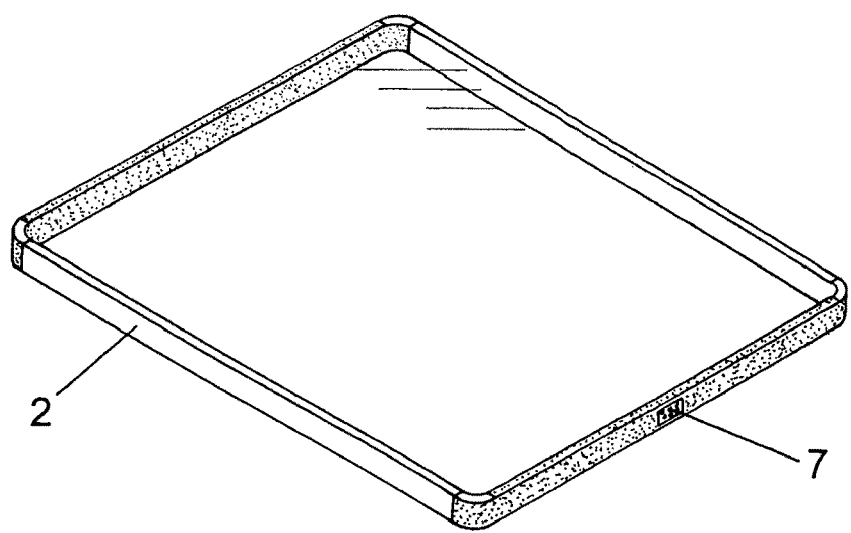
FIG. 2 is a perspective view illustrating a pellicle of the present invention.
Figure 3:
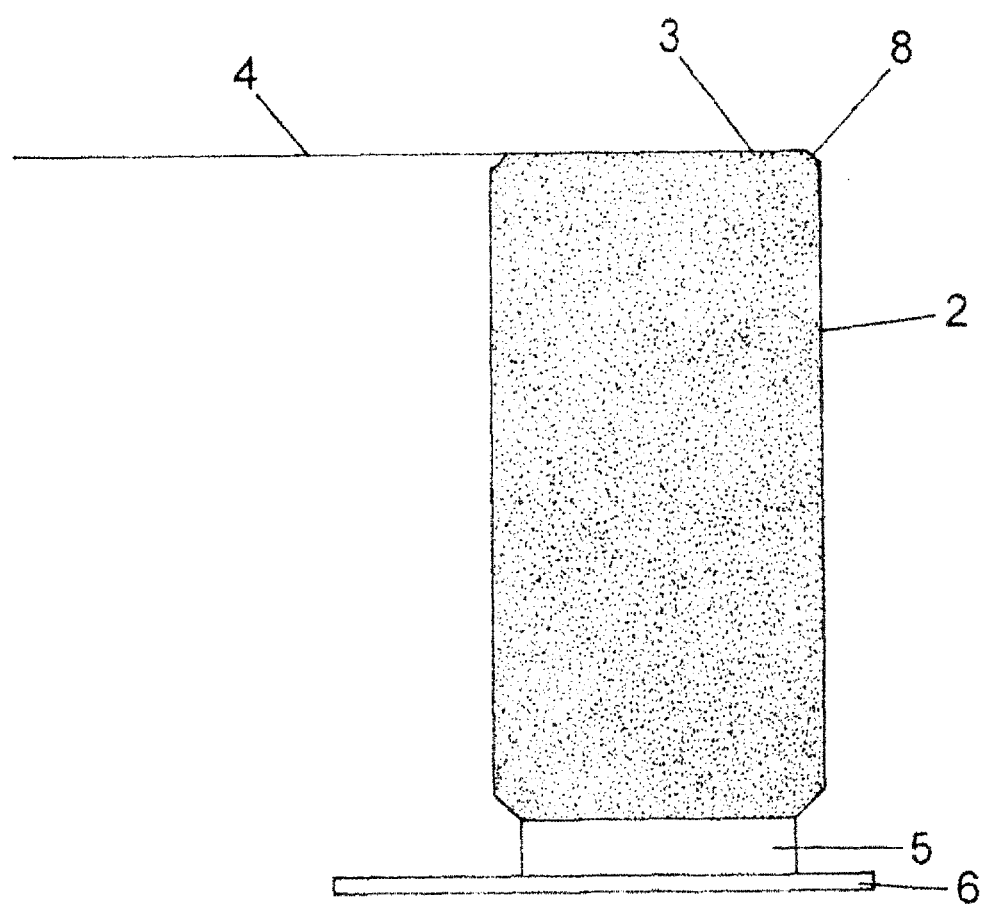
FIG. 3 is an expanded cross-sectional view showing a more relevant part of a pellicle according to the present invention.

A pellicle 1 according to the present invention comprises, as shown in FIGS. 1 and 2, a pellicle frame 2, a pellicle membrane 4 bonded on the upper frame face of the frame 2 via a membrane-bonding adhesive 3, and then, usually, a mask-bonding adhesive layer 5 laid on the lower frame face, and a releasable liner 6 attached to the lower face of the mask-bonding adhesive layer 5. Now, the reference numeral 7 designates an air vent hole which provides an air passage through the pellicle frame.

In this invention, the scale of the pellicle components is similar to that of the pellicle components ordinarily used for lithography operation for manufacture of large-sized liquid crystal display board, and the frame size in approximation is 300 mm×300 mm to 1500 mm×1500 mm.

The material for the pellicle frame can be any that is conventionally used, but in consideration of the deformation a material which is too soft is not recommended, and steels such as a stainless steel is employable but light-weight aluminum alloys such as JIS A7075, JIS A6061, and JIS A5052 r preferred.

The pellicle frame is formed and shaped to have the necessary configuration, holes for jigs, and chamfers along the edges through machining of a plate material obtained by pressure rolling or extrusion molding. Chamfers are made along the frame edges for the purpose of preventing the formation of dents at frame edges caused by something that hits upon the frame accidentally during mechanical tooling and later handling of the product pellicle, which results in defects in performance as well as appearance.

Figure 4:
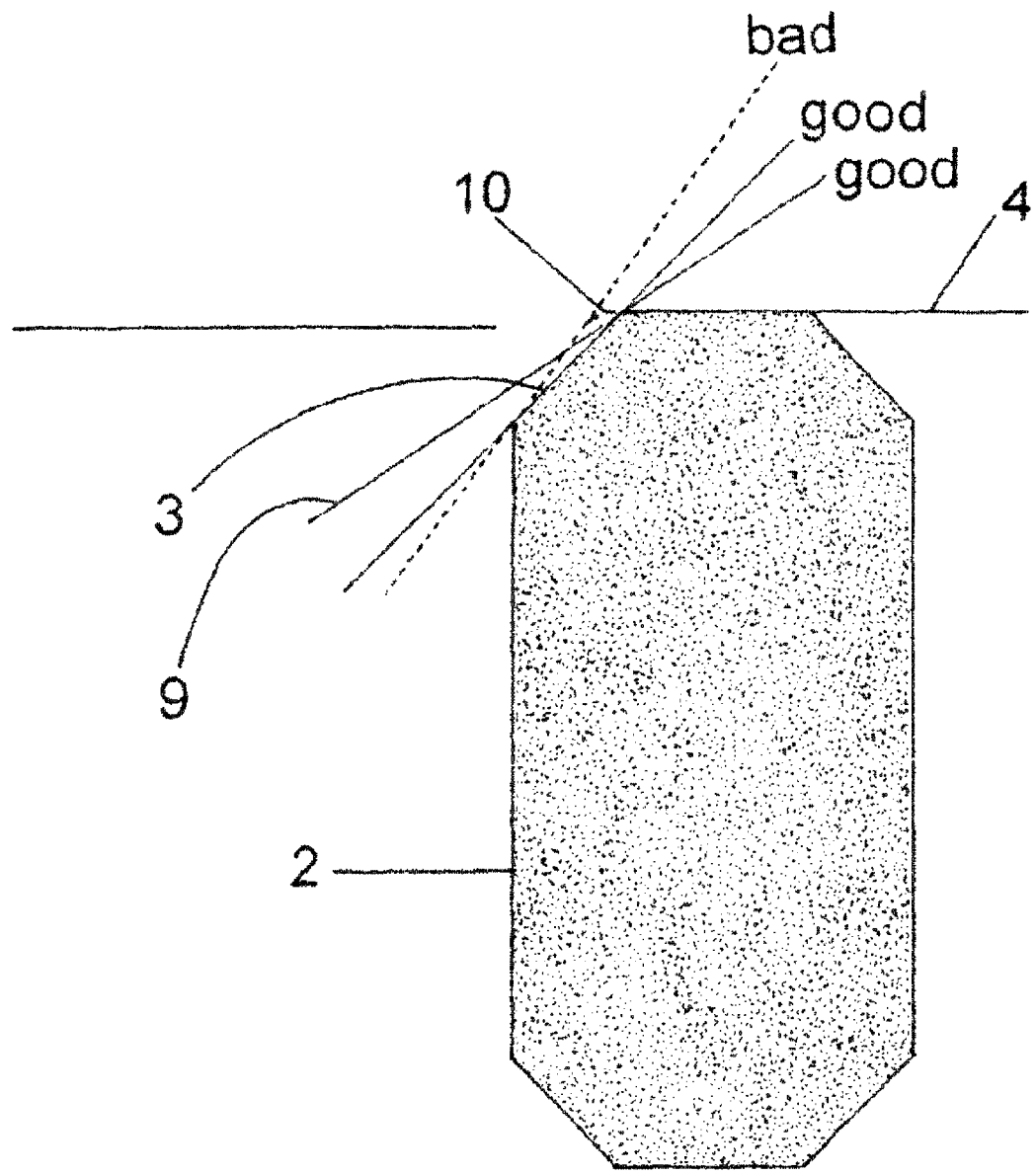
FIG. 4 is another expanded cross-sectional view showing a more relevant part of a pellicle according to the present invention.

In general the size of the chamfer is approximately C:0.2 mm-C:1.0 mm. In this invention, the inventor paid his attention to the chamfer face 8, which is made along an outer edge of the upper frame face. In a later stage of removing the excessive part of the membrane, a human would cut the membrane along the chamfer with a knife 9 so that, as shown in FIG. 4, depending on which part of the chamfer face 8 the knife 9 touches, the burr 10 is generated lowering stability of the product quality.

According to the present invention, the burr problem is solved by changing the size of the chamfer along the outer edge of the upper frame face to be approximately C:0.01 mm-C:0.12 mm, whereby it becomes easier for the operator to cause the knife to touch either the upper edge of the chamfer face 8 or the entirety of the chamfer face 8. Therefore, the size of the chamfer should be no greater than C:0.12 mm; on the contrary it should not be less than C:0.01 mm because such a small chamfer would not prevent dents from forming along the outer edge of the upper frame face and hence cannot improve the quality stability. Thus, the chamfer size must be C:0.01 mm-C:0.12 mm.

The surfaces of the pellicle frame are usually de-lustered by means of sand blasting or chemical polishing, and in the present invention, the method of de-lustering can be any conventionally employed one. For example, in the case of an aluminum frame, a method is known to be employed wherein the frame surfaces are first blasted with beads made of a material such as stainless steel, carborundum, or glass, and then the surfaces are chemically polished with NaOH, etc.

The anodic oxidation of the frame surface can be conducted by any of the known procedures, but generally this treatment is carried out in an acidic electrolytic solution. As the acidic electrolytic solution, solutions of sulfuric acid, oxalic acid and the like are employed in general. After the acidic oxidation, the frame surface undergoes coloring with a black dye, cavity sealing in a hot water containing a sealing agent such as nickel acetate, and washing to complete the frame treatment.

In the frame at least one air vent hole 7 is made through at least one frame bar extending in a direction parallel to the frame faces.

There are no particular limitations to the size, shape, number or positions for the air vent holes, but they can be determined by the mesh size, filtration area, or the desired quantity of airflow calculated to from the former two parameters, of a (dust-fending) filter which is installed in the air vent hole. It is preferable, though, that the width of the air vent hole is not greater than necessary and the number of the hole is as small as possible.

As the dust-fending filter used in the present invention, there are no particular limitations to its size, number or position so long as it can be installed in the air vent hole. The material of which the filter is made can be selected from resins (including PTFE and Nylon 66), metals (including 316 L stainless steel), ceramics (including alumina and aluminum nitride) and the like. It is also preferable that a chemical filter, which absorbs and decomposes chemical substances existing in the environment, is juxtaposed with the dust-fending filter in a position external to the dust-fending filter.

There is no limitation to the kind of the pellicle membrane to be used in the present invention, but the examples of advantageously employed materials for the membrane include amorphous fluorine-containing polymers, cellulose nitrate, and modified cellulose nitrate, which are conventionally used for excimer laser. Examples of amorphous fluorine-containing polymer include Citop (a product of Asahi Glass Co., Ltd.), TEFLON (a trademark), and AF (a product of Du Pont).

In the time of making the pellicle membrane, any of these polymers may be dissolved, to an extent necessary, in a solvent, and such solvents as fluoro-philic solvents dissolve the polymers well. In order to shape these polymers into pellicle membrane, such methods as spin coating, bar coating and die coating can be employed. Other methods may be adopted so long as the resulting membrane has the necessary properties for a pellicle membrane.

The adhesive for bonding the pellicle membrane can be any of the conventionally used ones, for example ones made of acrylic resin, epoxy resin, silicone resin, and fluorine-containing resin like fluorine-containing silicone resin, and among these, silicone resin adhesives and the fluorine-containing resin adhesives are preferred for the reason of having high light resistance. An example of fluorine-containing resin adhesive is CT69 (a product of Asahi Glass Co., Ltd.).

The adhesive for bonding the reticle can be pressure sensitive adhesive double coated tape, silicone resin adhesive, acrylic resin adhesive or the like.

The pellicle according to the present invention can be fabricated by tensely pasting a pellicle membrane on the upper frame face by means of any conventionally employed method using the membrane-bonding adhesive, and usually laying the mask-bonding adhesive layer on the lower frame face, and finally covering the exposed face of this mask-bonding adhesive layer with a releaser layer (liner), which protects the adhesive layer and is capable of smoothly detaching from the adhesive layer.

Now, the membrane-bonding adhesive layer which is laid over the upper frame face of the pellicle can be formed by first diluting a product adhesive by a solvent to an appropriate extent, if necessary, and then applying the adhesive over the upper frame face of the pellicle, followed by heating and drying it to harden. Incidentally, the adhesive can be applied in ways such as brush coating, spraying and automatic dispensing.

The choice for the material of which the releasable liner to be used in the present invention for protecting the mask-bonding adhesive layer is made is not specially limited. For example, PET, PTFE, PFA, PE, PC PVC, PP and the like will do.

It is possible to adopt one of these materials to make a base layer, and to coat its surface with a releasing agent which is suitably repellent to the particular mask-bonding adhesive used.

A detailed description as to the operation for manufacturing the pellicle follows.

First, a polymer dissolved with a solvent is applied to a flat surface of a large-sized base plate by means of a method such as spin coating; then, the polymer solution is dried at a temperature near the boiling point of the solvent, whereby a pellicle membrane is formed.

Next, an adhesive is applied to a frame face of a temporary frame, which has been fabricated to have a size comparable to the base plate; then the temporary frame is bonded, by its adhesive-applied frame face, on the pellicle membrane formed over the base plate. After this bonding operation, the temporary frame is removed from the base plate, and thus the pellicle membrane is transferred to the temporary frame. This membrane carried by the temporary frame is then brought to contact with and, thereby, permanently combine with the upper frame face of the pellicle frame by means of an adhesive prepared on the upper frame face of the pellicle frame beforehand; then it is now possible to shape a pellicle after cutting and removing the surplus portions of the membrane, which are extending beyond the outer edges of the pellicle frame with a cutter.

EXAMPLES OF THE INVENTION

Examples of the invention will be described herein below.

Example 1

In the first place, a rectangular frame made of an aluminum alloy A5052 was machined out as the pellicle frame, having the outer peripheral dimension of 474 mm×782 mm, the width of the longer side bar of 7.0 mm, the width of the shorter side bar of 6.0 mm, and the frame thickness, that is the distance between the upper and lower frame faces, of 5.5 mm. The outer edges of the membrane-bonding upper frame face were machined to have chamfer faces of C:0.01 mm, and the other edges of the frame were machined to have chamfer faces of C:0.2 mm. Through the middle portion of one of the bars of the frame were made ten air vent holes each having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute. Thereafter, the frame was dipped in a bath of NaOH aqueous solution for ten seconds for washing, and then the to frame was subjected an anodic oxidation in a 14% sulfuric acid aqueous solution at a solution temperature of 18 degrees centigrade under an anodization voltage of 10V (1.3 A).

Meanwhile, as a temporary frame for the pellicle membrane, a rectangular frame made of an aluminum alloy A7075-T651 was machined out to have the outer peripheral dimension of 800 mm×920 mm, the width of the side bars of 6 mm, and the frame thickness of 6 mm.

Next, the inward looking faces of the pellicle frame were coated with a silicone resin adhesive to a thickness of 1 micrometer by means of a spray coating machine.

Then, a filter made of PTFE and having a dust filtration capability of 99.9999% for dust particle sizes of 0.1 micrometer-3.0 micrometers, and having a dimension of 9.5 mm in width, 2.5 mm in height and 300 micrometers in thickness was installed in each air vent hole.

Next, Citop CTX809 (a Trademark of Asahi Glass Co., Ltd.) was dissolved in a fluorine-containing solvent Fluorinert Electronic Liquid FC-75 (a Trademark of 3M United States) to obtain a solution of 8% concentration. Then this solution was laid over a mirror-polished face of a quartz glass base plate having an external dimension of 850 mm×1200 mm by means of a spin coater to form a 4 micrometer-thick transparent membrane.

Next, the above-mentioned temporary frame for the pellicle membrane was attached to this membrane by means of an epoxy resin adhesive ARALDITE RAPID (a Trademark of SHOWA HIGHPOLYMER CO., LTD) and the membrane was thus peeled off from the base plate.

Next, the upper frame face of the pellicle frame made of an aluminum alloy, which had been prepared as described above, was wetted with a silicone resin adhesive, and this adhesive was dried to harden by heating at a temperature of 100 degrees centigrade for ten minutes. Also, a silicone resin adhesive was laid over the lower frame face of the aluminum alloy pellicle frame and was dried to harden by heating at a temperature of 100 degrees centigrade for ten minutes. A releasable liner made of PET was procured and was attached to the silicone resin adhesive layer on the lower frame face by means of a liner application machine having a image processing position control mechanism equipped with a CCD camera.

Then, the afore-mentioned finished pellicle frame was placed in contact with the film surface of the Citop, which had been peeled off and transferred to the temporary frame, whereby the pellicle frame and the membrane were firmly bonded together. The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became 0.5 g/cm.

Thereafter, the surplus portion of the membrane which extended beyond the pellicle frame was cut off and removed by slitting the membrane with a cutter knife along the external edges of the membrane-bonding face of the pellicle frame.

Observing the appearance of the cut edges of the membrane after the slitting, no cut burrs were identified and no dust particles larger than 0.5 micrometer in diameter were found on the membrane.

Example 2

In the first place, a rectangular frame made of an aluminum alloy A7075-T651 was machined out as the pellicle frame, having the outer peripheral dimension of 474 mm×782 mm, the width of the bar of 6.5 mm, and the frame thickness of 7 mm.

The outer edges of the membrane-bonding upper frame face were machined to have chamfer faces of C:0.1 mm, and the other edges of the frame were machined to have chamfer faces of C:0.2 mm. Through the middle portion of one of the bars of the frame were made ten air vent holes each having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute.

Thereafter, the frame was dipped in a bath of NaOH aqueous solution for ten seconds for washing, and then the frame was subjected an anodic oxidation in a 14% sulfuric acid aqueous solution at a solution temperature of 18 degrees centigrade under an anodization voltage of 10V (1.3 A).

Meanwhile, as a temporary frame for the pellicle membrane, a rectangular frame made of an aluminum alloy A6061-T651 was machined out to have the outer peripheral dimension of 800 mm×920 mm, the width of the side bars of 5 mm, and the frame thickness of 5 mm.

Next, the inward looking faces of the pellicle frame were coated with a silicone resin adhesive to a thickness of 1 micrometer by means of a spray coating machine.

Then, a filter made of PTFE and having a dust filtration capability of 99.9999% for dust particle sizes of 0.1 micrometer-3.0 micrometers, and having a dimension of 9.5 mm in width, 2.5 mm in height and 300 micrometers in thickness was installed in each air vent hole.

Next, Citop CTX809 (a Trademark of Asahi Glass Co., Ltd.) was dissolved in a fluorine-containing solvent Fluorinert Electronic Liquid FC-75 (a Trademark of 3M United States) to obtain a solution of 8% concentration. Then this solution was laid over a mirror-polished face of a quartz glass base plate having an external dimension of 850 mm×1200 mm by means of a spin coater to form a 4 micrometer-thick transparent membrane.

Next, the above-mentioned temporary frame for the pellicle membrane was attached to this membrane by means of an epoxy resin adhesive ARALDITE RAPID (a Trademark of SHOWA HIGHPOLYMER CO., LTD) and the membrane was thus peeled off from the base plate.

Next, the upper frame face of the pellicle frame made of an aluminum alloy, which had been prepared as described above, was wetted with a silicone resin adhesive, and this adhesive was dried to harden by being heated at a temperature of 100 degrees centigrade for ten minutes. Also, a silicone resin adhesive was laid over the lower frame face of the aluminum alloy pellicle frame and was dried to harden by heating at a temperature of 100 degrees centigrade for ten minutes. A releasable liner made of PET was procured and was attached to the silicone resin adhesive layer on the lower frame face by means of a liner application machine having a image processing position control mechanism equipped with a CCD camera.

Then, the afore-mentioned finished pellicle frame was placed in contact with the film surface of the Citop, which had been peeled off and transferred to the temporary frame, whereby the pellicle frame and the membrane were firmly bonded together. The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became 0.5 g/cm.

Thereafter, the surplus portion of the membrane which extended beyond the pellicle frame was cut off and removed by slitting the membrane with a cutter knife along the external edges of the membrane-bonding face of the pellicle frame.

Observing the appearance of the cut edges of the membrane after the slitting, no cut burrs were identified and no dust particles larger than 0.5 micrometer in diameter were found on the membrane.

Comparative Example

A Comparative Example will be described herein below.

In the first place, a rectangular frame made of an aluminum alloy A5052 was machined out as the pellicle frame, having the outer peripheral dimension of 474 mm×782 mm, the width of the longer side bar of 7.0 mm, the width of the shorter side bar of 6.0 mm, and the frame thickness of 5.5 mm. Then, the outer edges of the membrane-bonding upper frame face were machined to have chamfer faces of C:0.2 mm, and the other edges of the frame were machined to have chamfer faces of C:0.2 mm. Through the middle portion of one of the bars of the frame were made ten air vent holes each having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute. Thereafter, the frame was dipped in a bath of NaOH aqueous solution for ten seconds for washing, and then the to frame was subjected to anodic oxidation in a 14% sulfuric acid aqueous solution at a solution temperature of 18 degrees centigrade under an anodization voltage of 10V (1.3 A).

Meanwhile, as a temporary frame for the pellicle membrane, a rectangular frame made of an aluminum alloy A6061-T651 was machined out to have the outer peripheral dimension of 800 mm×920 mm, the width of the side bars of 12 mm, and the frame thickness of 10 mm. Next, the inward looking faces of the pellicle frame were coated with a silicone resin adhesive to a thickness of 1 micrometer by means of a spray coating machine.

Then, a filter made of PTFE and having a dust filtration capability of 99.9999% for dust particle sizes of 0.1 micrometer-3.0 micrometers, and having a dimension of 9.5 mm in width, 2.5 mm in height and 300 micrometers in thickness was installed in each air vent hole.

Next, Citop CTX809 (a Trademark of Asahi Glass Co., Ltd.) was dissolved in a fluorine-containing solvent Fluorinert Electronic Liquid FC-75 (a Trademark of 3M United States) to obtain a solution of 8% concentration. Then this solution was laid over a mirror-polished face of a quartz glass base plate having an external dimension of 850 mm×1200 mm by means of a spin coater to form a 4 micrometer-thick transparent membrane.

Next, the above-mentioned temporary frame for the pellicle membrane was attached to this membrane by means of an epoxy resin adhesive ARALDITE RAPID (a Trademark of SHOWA HIGHPOLYMER CO., LTD) and the membrane was thus peeled off from the base plate.

Next, the upper frame face of the pellicle frame made of an aluminum alloy, which had been prepared as described above, was wetted with a silicone resin adhesive, and this adhesive was dried to harden by heating at a temperature of 100 degrees centigrade for ten minutes. Also, a silicone resin adhesive was laid over the lower frame face of the aluminum alloy pellicle frame and was dried to harden by heating at a temperature of 100 degrees centigrade for ten minutes. A releasable liner made of PET was procured and was attached to the silicone resin adhesive layer on the lower frame face by means of a liner application machine having an image processing position control mechanism equipped with a CCD camera.

Then, the afore-mentioned finished pellicle frame was placed in contact with the film surface of the Citop, which had been peeled off and transferred to the temporary frame, and the pellicle frame was heated by an IR lump; the pellicle frame and the membrane were firmly bonded together. The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became 0.5 g/cm.

Thereafter, the surplus portion of the membrane which extended beyond the pellicle frame was cut off and removed by slitting the membrane with a cutter knife along the external edges of the membrane-bonding face of the pellicle frame.

Observing the appearance of the cut edges of the membrane after the slitting, many cut burrs were identified; also ten dust particles measuring 10-20 micrometers in diameter were found on the membrane.

Other examples and comparative examples were conducted under different conditions, and their results are entered in Table 1 below.

TABLE 1

Chamfer sizes and the appearance of resulting cut edges

| | | Chamfer size C: xmm x = | burrs | dust particles | remarks |
|---|---|---|---|---|---|
| Examples | 1 | 0.01 | none | 0 | |
| | 2 | 0.02 | none | 0 | |
| | 3 | 0.05 | none | 0 | |
| | 4 | 0.07 | none | 0 | |
| | 5 | 0.10 | none | 0 | |
| | 6 | 0.12 | a few | 0 | |

TABLE 1-continued

Chamfer sizes and the appearance of resulting cut edges

|  |  | Chamfer size C: xmm x = | burrs | dust particles | remarks |
|---|---|---|---|---|---|
| Comparative Examples | 1 | 0.15 | many | 0 | |
| | 2 | 0.20 | many | *10 | |
| | 3 | 0.25 | many | *14 | |
| | 4 | 0.00 | none | 0 | damages found on the edges |

*(Dust particles of Comparative Example 2 were 10-20 micrometers in diameter and those of Comparative Example 3 were 5-20 micrometers in diameter)

EXPLANATION FOR REFERENCE NUMERALS 1. pellicle
2. pellicle frame
3. pellicle membrane-bonding adhesive
4. pellicle membrane
5. mask (reticle)-bonding adhesive
6. liner for protecting mask-bonding adhesive
7. air vent hole
8. chamfer face along an outer edge of the upper frame face of the pellicle frame
9. knife blade
10. burr

What is claimed is:

1. A pellicle for lithography comprising a pellicle frame of which at least one side has a length not smaller than 300 mm, a pellicle membrane bonded on a first frame face of said pellicle frame by means of a membrane-bonding adhesive, and a mask-bonding adhesive layer attached to a second frame face of said pellicle frame, characterized in that said pellicle frame is chamfered along each of its edges where said first frame face joins an inner side wall of the pellicle frame or an outer side wall of the pellicle frame and along each of its edges where said second frame face joins the inner side wall of the pellicle frame or the outer side wall of the pellicle frame, and in that the chamfer made along those edges where said first frame face joins the outer side wall of the pellicle frame has a chamfer face size greater than C:0.01 mm but not greater than C:0.12 mm.

2. The pellicle for lithography according to claim 1 characterized in that the pellicle frame is made of an aluminum alloy of which the surface is almite-anodized.

3. A method for manufacturing a pellicle for lithography having a pellicle frame, a pellicle membrane bonded on a first frame face of said pellicle frame by means of a membrane-bonding adhesive, and a mask-bonding adhesive layer attached to a second frame face of said pellicle frame, comprising:

(i) a step of chamfering said pellicle frame along each of its edges where said first frame face joins an inner side wall of the pellicle frame or an outer side wall of the pellicle frame and along each of its edges where said second frame face joins the inner side wall of the pellicle frame or the outer side wall of the pellicle frame, the chamfer made along those edges where said first frame face joins the outer side wall of the pellicle frame having a chamfer face size greater than C:0.01 mm but not greater than C:0.12 mm, and (ii) a step of cutting off an excessive portion of the pellicle membrane bonded on said first frame face which extends beyond outer edges of said first frame face, wherein a blade of a knife is caused to scour a chamfer over the membrane in a manner such that the knife blade is kept in a face-to-face contact with the chamfer face while the knife blade is moved along the chamfered edge of the frame.

4. A method for manufacturing a pellicle for lithography having a pellicle frame, a pellicle membrane bonded on a first frame face of said pellicle frame by means of a membrane-bonding adhesive, and a mask-bonding adhesive layer attached to a second frame face of said pellicle frame, comprising:

(i) a step of chamfering said pellicle frame along each of its edges where said first frame face joins an inner side wall of the pellicle frame or an outer side wall of the pellicle frame and along each of its edges where said second frame face joins the inner side wall of the pellicle frame or the outer side wall of the pellicle frame, the chamfer made along those edges where said first frame face joins the outer side wall of the pellicle frame having a chamfer face size greater than C:0.01 mm but not greater than C:0.12 mm, and (ii) a step of cutting off an excessive portion of the pellicle membrane bonded on said first frame face which extends beyond outer edges of said first frame face, wherein a blade of a knife is caused to scour a chamfer over the membrane in a manner such that the knife blade is kept in an angle such that the blade touches only that edge of the frame where the chamfer face meets the first frame face while the knife blade is moved along the chamfered edge of the frame.

5. The method for manufacturing a pellicle for lithography according to claim 3, further comprising:

a step of smoothing cut-end faces of the pellicle membrane after the cutting-off of said excessive portion of the pellicle membrane wherein the cut-end faces of the membrane are applied with solvent capable of dissolving the pellicle membrane by means of a resin wiper wetted with the solvent.

* * * * *